United States Patent [19]

Dumbeck

[11] 4,101,831
[45] Jul. 18, 1978

[54] LOAD MONITORING APPARATUS AND METHOD

[75] Inventor: Robert F. Dumbeck, Elgin, Tex.

[73] Assignee: Rexnord Inc., Milwaukee, Wis.

[21] Appl. No.: 750,736

[22] Filed: Dec. 15, 1976

Related U.S. Application Data

[63] Continuation-in-part of Ser. No. 675,780, Apr. 12, 1976, which is a continuation-in-part of Ser. No. 548,011, Feb. 7, 1975, abandoned.

[51] Int. Cl.² ............................................. G01P 3/48
[52] U.S. Cl. ..................................... 324/166; 324/162
[58] Field of Search ........................ 324/160, 162, 166; 307/121, 5

[56] References Cited

U.S. PATENT DOCUMENTS

| 3,679,894 | 7/1972 | Smith | 324/162 X |
|---|---|---|---|
| 3,710,246 | 1/1973 | Herring | 324/162 |
| 3,719,888 | 3/1973 | Sampey | 324/166 |
| 3,746,985 | 7/1973 | Perron | 324/166 |
| 3,780,579 | 12/1973 | Barnard | 324/166 X |
| 3,885,137 | 5/1975 | Ooya et al. | 324/162 |

*Primary Examiner*—Rudolph V. Rolinec
*Assistant Examiner*—Vincent J. Sunderdick
*Attorney, Agent, or Firm*—Laurence R. Brown

[57] ABSTRACT

Electronic circuitry senses motion of a load bearing movable element which has a speed relationship as a function of load by establishing a sequence of timing pulses varying in inter-pulse duration time as a function of the movement speed and processes those pulses to produce electronic indicia signals used for control or display purposes. Sampled timing pulses are taken from the sequence to generate a control pulse of predetermined time duration. The control pulse duration is compared with the speed or loading signal comprising a pulse of time duration between sequential timing pulses thereby to produce an indicia analog signal variable over a range of load conditions. The indicia signals is used for display or control functions responsive to the load borne by the movable element within a predetermined analog range.

7 Claims, 3 Drawing Figures

LOAD MONITORING APPARATUS AND METHOD

This is a continuation-in-part of copending application U.S. Ser. No. 675,780 filed Apr. 12, 1976 which in turn is a continuation-in-part of U.S. Ser. No. 548,011 filed Feb. 7, 1975 now abandoned.

This invention relates to load monitoring and more particularly to electronic processing of changes in the speed of movement of a load bearing movable element.

BACKGROUND OF THE INVENTION

The subject matter of patent application U.S. Ser. No. 584,011 is contained herein by reference in its entirety and forms part of this disclosure. In that application there is described and claimed apparatus and methods for providing indicia and control signals as a function of slip of an induction motor under load. This provides monitoring over an analog range of load conditions on the motor where specified load conditions within said range can be selected for alarm and control functions by electronic techniques.

However, this prior application and other prior art techniques are generally limited to periodically recurring functions measured from rotating shafts and do not provide for analog load monitoring over a range of load conditions where the prime mover may work intermittently, or where instantaneous sampling may be desired such as when a linear movable element such as the shaft of a hydraulic piston is used to drive a load.

Speed monitoring control devices such as those of U.S. Pat. No. 3,184,606, May 18, 1965 or U.S. Pat. No. 3,739,367, June 12, 1973 do not provide an adequate capability either of operation over a selected range of speed conditions or for intermittently sampling speed at predetermined times, nor do they provide any means for a continual visual monitor of speed being encountered.

Furthermore, speed monitoring devices are primarily governors indicating a single speed condition which are not adapted to work over an analog range of load conditions. Such devices are not readily adaptable to choice of different load conditions at which controls may be effected or for display of variations of load conditions within a load range.

OBJECTS OF THE INVENTION

Accordingly, it is a general object of this invention to provide improved load monitoring and control apparatus and methods.

A more specific object of the invention is to provide apparatus monitoring load conditions over a predetermined range of conditions.

Another object of the invention is to produce upon demand instantaneously or intermittently load conditions encountered in a wide range of movable elements under load.

BRIEF DESCRIPTION OF THE INVENTION

Therefore, in accordance with this invention any movable element which has a movement speed as a function of load can be monitored to provide over a range of load conditions an analog signal for use in indicia or load control devices. A sequence of timing pulses is derived from the movement speed of the element. Samples taken from this sequence synchronously develop a control pulse of predetermined time duration. The load condition is determined from the time duration between selected timing pulses in the sequence. Then an analog indicia signal of variable duration is derived by comparison of the two time durations to produce a difference pulse.

THE DRAWING

Further principles, features, objectives and advantages will be recognized in the following more detailed description which refers to the accompanying drawing, wherein:

FIG. 1 is a sketch showing the derivation of a sequence of timing pulses from a movable element with speed variable under load, FIG. 2a through i is a waveform chart showing the derivation of analog load indicia signals having a time duration variable with load, and FIG. 3 is a one line block schematic diagram of an electronic circuit embodiment of the invention producing load indicia signals from movement speed of a loaded element.

DETAILED DESCRIPTION OF THE INVENTION

Figure 1:
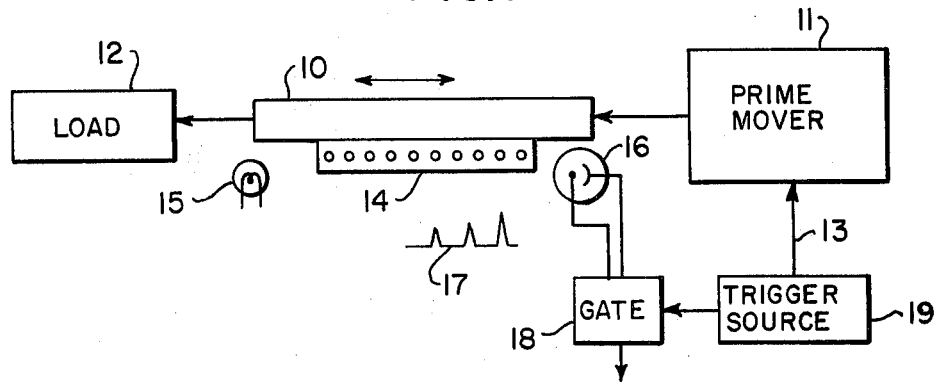

In FIG. 1 is exemplified schematically a typical moving element 10 driven by a prime mover 11 such as a hydraulic cylinder to actuate a load 12 over a linear extend-retract cycle upon demand of a demand trigger signal at 13, either intermittently or cyclically. Thus, for example, the system could be a hydraulic brake system, an engine where movable element 10 is a piston rod or a production machinery system where element 10 is a movable part in a system operated by an electric motor prime mover 11. For operation with the present invention, wherein element 10 has a movement speed which is a function of the load imposed at 12, it is necessary to derive a sequence of spaced electrical pulses representative of the speed of movement of element 10. This is derived from a rotary cyclic element in the manner set forth in said copending application. For a linear motion element such as shown in FIG. 1 the pulses may be derived by an aperture plate 14, interposed between lamp 15 and photocell 16 for example. Thus, upon movement of the element 10, which is connected to move plate 14, a series of timing pulses 17 will be derived at the sensor indicating the speed of movement of element 10 by the spacing between the pulses. In the event that pulses should be synchronized to extract the meaningful pulses, such as for example those of the power stroke only of a hydraulic cylinder prime mover, the gate 18 can be operated from the trigger source 19 coupled with prime mover 11. Thus, timing pulses derived at gate 18 represent those which will be used to evaluate the loading conditions on movable element 10. For continuous cyclic load conditions such as those imposed upon a rotating shaft, gating is not necessary, and it can be done to select desired pulse sequences in other ways.

Figure 2:
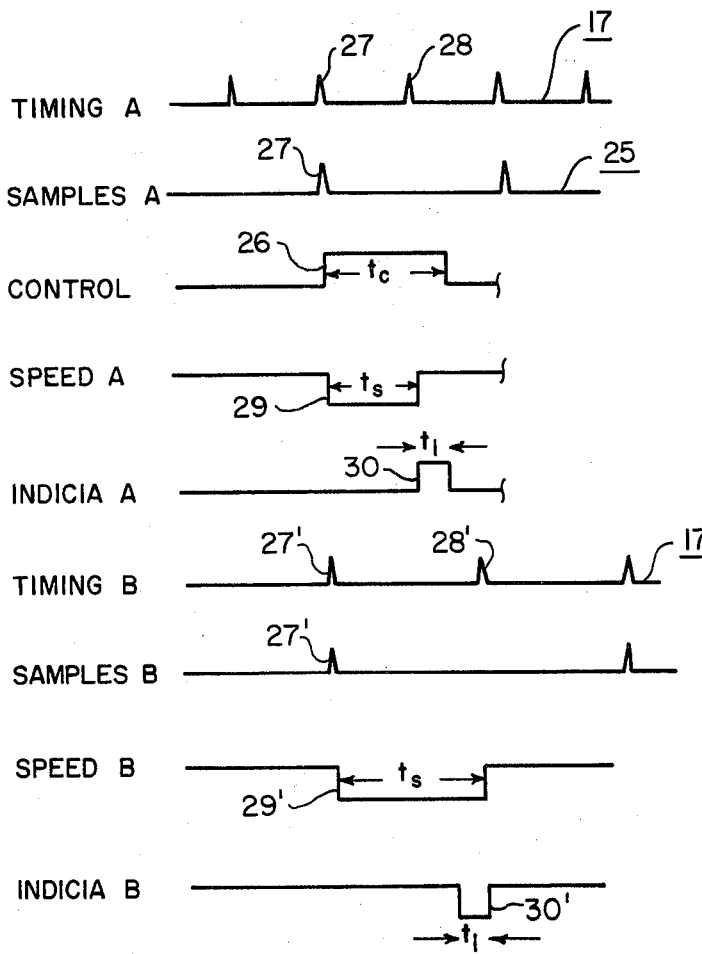

As may be seen from FIG. 2, two sets of different timing pulses 17 representing different operational speeds are designated A and B in waveforms 17 and 17' respectively. From these waveform diagrams of FIG. 2, it will become evident that the load characteristics of the movable element 10 may be derived over a continuously variable analog range of load conditions for use in either a visual indication meter or for automated control purposes in a system using the output pulse indicia provided.

Sampled pulses 25 may be derived from the timing pulse sequence 17 such as by counting out every other pulse, or by other selection techniques such as demand switching either intermittently or in response to some synchronous system condition. Gate 18 in FIG. 1 serves a sampling function, for example. In the illustrative example of FIG. 2 where every other timing pulse is sampled, particular advantage results in the scope of analog range of output load signals observable.

Thus, both the timing pulses 17 and the sampled pulses 25 may be used to derive the further waveforms. To derive an analog signal representative of the load a control waveform 26 of a predetermined time duration $t_c$ is derived in response to the timing sample pulse 27. This may either be a single sample pulse or a periodically recurring waveform, depending upon the output utilization system in which the load monitor of this invention is utilized. If it comprises simply an analog meter display, then a periodically recurring sample is desirable, as will be later discussed.

Since the actual instantaneous speed of the element 10 is indicated by the spacing of timing pulses 17, then the time duration $t_s$ between two successive pulses 27, 28 may be chosen to represent the element speed. Accordingly waveform pulse 29 is derived. In this embodiment, the polarity of the speed pulse 29 is opposite that of control pulse 26, and preferably of the same amplitude, so that a difference pulse signal 30 may easily be derived in an AND type comparator. The difference pulse indicia signal therefore will vary in time duration $t_i$ as an analog function of the load on the movable element 10. Thus, it is seen that as the speed pulse 29 duration decreases, the indicia pulse 30 duration increases and vice versa up to the condition at which the length of the two pulses 26, 29 are equal. This condition for example can be calculated by selection of repetition rates of the timing pulses 17 together with the duration $t_c$ of the control pulse in the manner set forth in said copending application. One desirable mode of operation is to select the equal length of the two pulses 26, 29 at 100% rated load conditions, and therefore both overload and underload conditions can be simply observed with minimal analysis equipment.

Consider in this respect the change of indicia pulse 30' polarity illustrated by waveforms B, the speed B and indicia B waveforms, as the speed pulse 29' becomes longer in duration than the control pulse 26 under conditions where timing pulses B are encountered. For this condition in the described embodiment the duration of control pulse 26 is chosen at a duration intermediate in the range to be observed of durations between successive timing pulses 27, 28.

Figure 3:
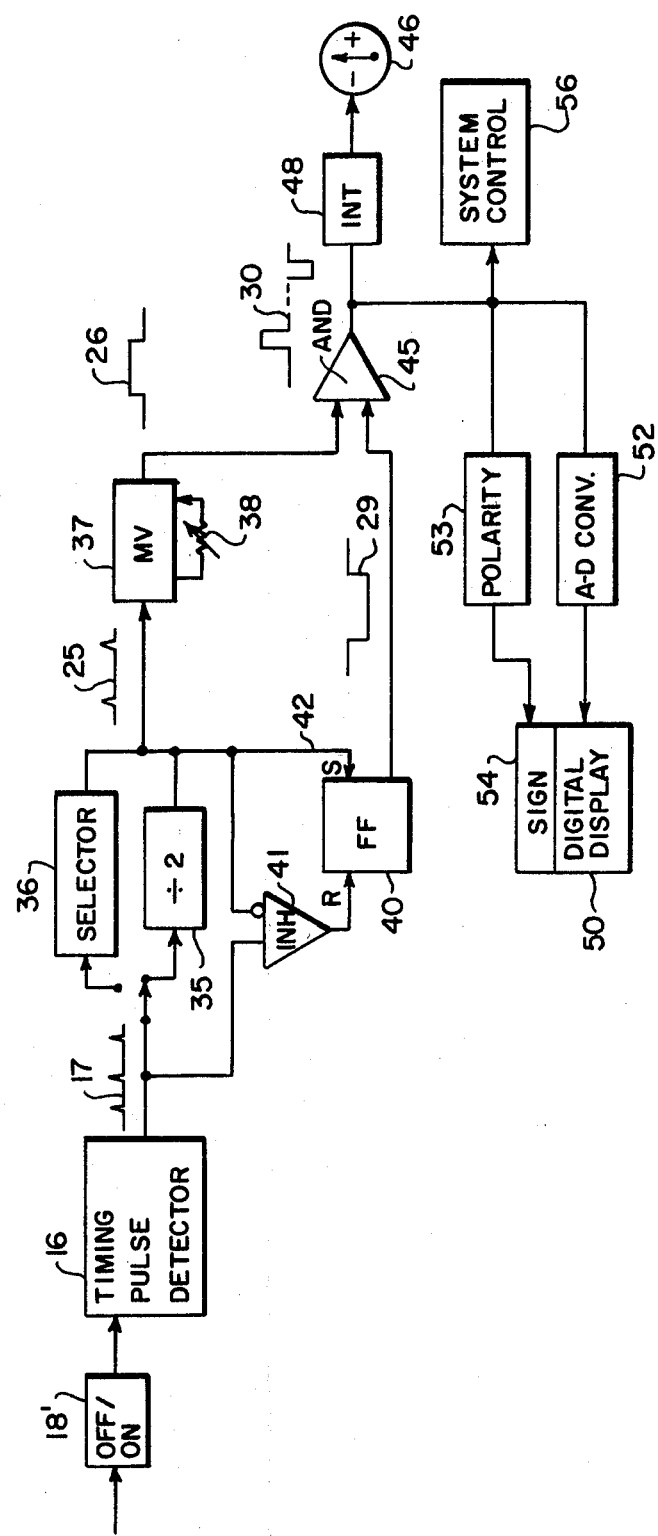

A simplified load monitoring system made possible from these waveform conditions is shown in single line block diagram form in FIG. 3. It is seen that the timing pulse sequence 17 is derived from a detector such as the photocell 16 of FIG. 1. The off-on switch 18' may be equivalent to the gate 18 and could for example comprise a hydraulic switch operable from pressure lines to a hydraulic cylinder on the power stroke. Alternatively 18' could be equivalent selection devices for synchronous timing in a system or simply an off-on switch.

The sampled pulses 25 are derived by means of a binary counter 35 or other selection means 36 such as a sampling switch actuated during a portion of a machine cycle. The latter means could simply be a bypass of counter 35 if the system is periodic and a change of the existing detected waveform 17 is not necessary or desirable.

A single-shot multivibrator 37, which may have an adjustment 38 to determine the duration of output pulse 26 supplies the timed duration control pulse in response to each sampled timing pulse of waveform 25 on a periodic or intermittent basis depending upon the nature of the input and the sampled timing pulses.

To derive the load pulse 29 as a function of the spacing between two sequential timing pulses of waveform 17, flip flop 40 is employed. Because selected pulses in waveform 25 are substantially coincident with corresponding pulses of waveform 17, to prevent erratic operation of the flip-flop 40 by inadvertent reset, the inhibit circuit 41 prevents reset in response to pulses of waveform 17 simultaneously presented at the time set pulses of waveform 25 are present at set lead 42. Thus, each sampled timing pulse on waveform 25 sets the flip-flop 40 and the next successive timing pulse in waveform 17 resets it to produce the speed or load pulse 29 of a duration substantially equal to the spacing between the timing pulses. It is elementary in the art to provide accuracy in circuitry, with respective delays and pulse timing characteristics taken into account, within the desired tolerances of accuracy for the instrumentation desired. Thus, load waveform pulse 29 and control waveform pulse 26 provide a medium of monitoring load characteristics on movable element 10 (FIG. 1) within close tolerances.

Because pulse waveforms 26 and 29 are of opposite polarity the output indicia waveform 30 can be simply derived in an AND circuit comparator 45 to derive the residual analog time duration pulse of appropriate polarity. This mode of operation provides a simple analog meter 46 display about a datum level at midscale on a zero center meter movement where center scale for example indicates 100% rated load and deflection ranges may be calibrated in the manner set forth in said copending application between 75% and 125% of full load, for example. The meter indication only requires an integrator circuit 48 which averages out the d-c level of periodically presented pulses of waveform 30 in the simplest case, or a peak load storage scheme in the case of intermittent signals.

For intermittently presented signals standard digital displays 50 may be used by using a pulse duration to magnitude analog to digital converter 52. The polarity is simply determined by a polarity sensor circuit 53 to establish the output digital sign at 54.

Wherever circuit controls are desirable from the indicia waveform, as exemplified by block 56, such may be effected for example by alarm control circuitry set forth in said copending application.

Having therefore set forth improvements over the existing prior art in load diagnosis instruments, those features believed descriptive of the spirit and nature of the invention are defined with particularity in the appended claims, with recognition that those skilled in the art can make variations based upon this invention which do not depart from the scope of the invention.

What is claimed is:
1. Apparatus displaying changes in loading by observing variations of speed of a moving element, comprising in combination,
    means deriving a sequence of timing pulses from movement of said element thereby identifying the speed of movement,
    means sampling pulses from said sequence, means responsive to sampled pulses to produce control pulses of predetermined duration, means deriving a load indicia pulse of duration substantially equal to that between sampled speed pulses and successive pulses in said sequence, means comparing the lengths of said control and load pulses, and load display means responsive to the comparison to provide an electrical indicia signal varying as a function of the load on said moving element.

2. Apparatus as defined in claim 1 wherein said moving element passes along a linear path of travel.

3. Apparatus as defined in claim 1 wherein said means responsive to the comparison comprises an analog meter movement calibrated to indicate load characteristics of said moving element over an analog range.

4. Apparatus as defined in claim 1 wherein said means comparing the lengths of said pulses provides an output pulse of changing polarity upon transition of the element movement speed through that speed whereby the duration of the load pulses equals the duration of said control pulses.

5. Apparatus as defined in claim 1 wherein said means sampling pulses from said sequence comprises a counter selecting pulses in said sequence.

6. The method of determining load of a moving element that varies in movement speed as a function of load comprising the steps of, deriving a sequence of spaced timing pulses identifying movement speed in response to movement of said element, establishing synchronously with at least one selected timing pulse in said sequence a predetermined time duration, measuring the time duration between said selected timing pulse and a sequential timing pulse in said sequence, comparing the said two time durations, and using the difference in said time durations as a load indicator.

7. The method defined in claim 6 including the step of establishing the predetermined time duration at an intermediate value within a range of variations of said time durations between pulses thereby to produce with comparison of said two time durations a difference signal having a datum level for a predetermined load condition when the two time durations are equal and an identifiable analog range of durations on opposite sides of said datum level.

* * * * *